(12) United States Patent
Morozumi et al.

(10) Patent No.: US 8,567,919 B2
(45) Date of Patent: Oct. 29, 2013

(54) PIEZOELECTRIC ELEMENT, PIEZOELECTRIC ACTUATOR, LIQUID EJECTING HEAD, AND LIQUID EJECTING APPARATUS

(75) Inventors: Koichi Morozumi, Shiojiri (JP); Toshiki Hara, Suwa (JP); Jiro Kato, Suwa (JP); Satoshi Denda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 232 days.

(21) Appl. No.: 12/880,295

(22) Filed: Sep. 13, 2010

(65) Prior Publication Data

US 2011/0063377 A1   Mar. 17, 2011

(30) Foreign Application Priority Data

Sep. 14, 2009  (JP) .................................. 2009-211434

(51) Int. Cl.
| | |
|---|---|
| *B41J 2/045* | (2006.01) |
| *H01L 41/18* | (2006.01) |
| *H01L 41/187* | (2006.01) |
| *C04B 35/495* | (2006.01) |
| *C04B 35/00* | (2006.01) |

(52) U.S. Cl.
USPC ... 347/68; 310/365; 252/62.9 R; 252/62.9 PZ

(58) Field of Classification Search
USPC .......... 347/68; 310/365; 252/62.9 PZ, 62.9 R
See application file for complete search history.

(56) References Cited

U.S. PATENT DOCUMENTS

| | | | | |
|---|---|---|---|---|
| 5,850,089 | A * | 12/1998 | Varshney et al. | 257/295 |
| 6,328,433 | B1 * | 12/2001 | Moriya et al. | 347/68 |
| 6,705,708 | B2 | 3/2004 | Murai | |
| 2002/0125515 | A1 * | 9/2002 | Joo et al. | 257/295 |

FOREIGN PATENT DOCUMENTS

| | | | |
|---|---|---|---|
| JP | 2000082786 A | * | 3/2000 |
| JP | 2002-314163 | | 10/2002 |
| JP | 2008074109 A | * | 4/2008 |

OTHER PUBLICATIONS

Wikipedia Article: Piezoelectricity, section Crystal Structures.*
Machine Translation of JP 2008074109 A.*

* cited by examiner

*Primary Examiner* — Lisa M Solomon
(74) *Attorney, Agent, or Firm* — Workman Nydegger

(57) ABSTRACT

A piezoelectric element includes a first conductive layer, a second conductive layer facing the first conductive layer, and a piezoelectric layer between the first and second conductive layers, composed of a compound oxide containing at least lead, zirconium, titanium, and oxygen. The piezoelectric layer includes a first crystal layer on the first conductive layer side of the piezoelectric layer and a second crystal layer continued from the first crystal layer, nearer to the second conductive layer side than the first crystal layer. In the piezoelectric layer, the lead concentration in the first conductive layer side of the first crystal layer is lower than that in the second conductive layer side of the second crystal layer. In the piezoelectric layer, the oxygen concentration in the first conductive layer side of the first crystal layer is higher than that in the second conductive layer side of the second crystal layer.

6 Claims, 12 Drawing Sheets

EXPERIMENTAL EXAMPLE 1

EXPERIMENTAL EXAMPLE 2

EXPERIMENTAL EXAMPLE 1

EXPERIMENTAL EXAMPLE 2

REFERENCE EXAMPLE

PIEZOELECTRIC ELEMENT, PIEZOELECTRIC ACTUATOR, LIQUID EJECTING HEAD, AND LIQUID EJECTING APPARATUS

CROSS-REFERENCE TO RELATED APPLICATIONS

This application claims the benefit of priority to Japanese Patent Application No. 2009-211434 filed Sep. 14, 2009, the contents of which are hereby incorporated by reference in their entirety.

BACKGROUND

1. Technical Field

The present invention relates to a piezoelectric element, a piezoelectric actuator, a liquid ejecting head, and a liquid ejecting apparatus.

2. Related Art

Piezoelectric elements have a structure in which a piezoelectric material composed of a crystallized piezoelectric ceramic or the like is interposed between two electrodes. Therefore, the piezoelectric elements can exhibit deformations such as expansion and contraction or the like by applying an electric field to the piezoelectric material. The piezoelectric elements are used as piezoelectric actuators of liquid ejecting heads and the like. A typical example of the piezoelectric actuators used for liquid ejecting heads is one driven in a flexural vibration mode.

An example of the liquid ejecting heads is an ink jet recording head or the like including a vibrating plate which constitutes a portion of a pressure-generating chamber communicated with a nozzle orifice which ejects ink droplets so that the vibrating plate is deformed by a piezoelectric element to apply pressure to ink introduced into the pressure-generating chamber, ejecting ink droplets from the nozzle orifice. The piezoelectric actuator provided on the ink jet recording head is formed by, for example, forming a uniform piezoelectric material layer over the entire surface of the vibrating plate and cutting the piezoelectric material layer in a shape corresponding to the pressure-generating chamber by lithography so that the actuator can be driven independently for each pressure-generating chamber.

In addition, the piezoelectric layers of such piezoelectric elements are formed by depositing thin films of a piezoelectric material such as lead zirconate titanate (PZT) or the like using a liquid phase process. For example, Japanese Unexamined Patent Application Publication No. 2002-314163 discloses a method for forming films by applying a piezoelectric material multiple times to form a piezoelectric layer. This publication describes that this film forming method can stably form a piezoelectric layer (engineered domain) with preferential orientation of (100) crystal plane in a direction normal to a substrate surface.

However, the performance required for piezoelectric elements becomes more strict, and it becomes difficult to achieve sufficient performance only by applying a piezoelectric material multiple times to form a piezoelectric layer. Therefore, for example, lattice matching between an electrode material and a piezoelectric layer, further lamination of another material (e.g., titanium), and the like are being investigated.

The inventors have found that in order to form a better engineered domain structure, it is important to suppress deterioration of crystals of a piezoelectric material near an interface between a piezoelectric layer and an electrode. It has been also found that the composition of the piezoelectric material greatly affects the control of crystals of the piezoelectric material near an interface between the piezoelectric layer and electrodes which hold the piezoelectric layer therebetween.

SUMMARY

An advantage of some aspects of the invention is that the invention provides a piezoelectric element having good crystal quality in a piezoelectric layer and good piezoelectric characteristics.

The invention has been achieved for resolving at least part of the above-mentioned problems and can be realized as embodiments or application examples described below.

APPLICATION EXAMPLE 1

A piezoelectric element according to an embodiment of the present invention includes a first conductive layer, a second conductive layer disposed to face the first conductive layer, and a piezoelectric layer disposed between the first conductive layer and the second conductive layer and composed of a compound oxide containing at least lead, zirconium, titanium, and oxygen. The piezoelectric layer includes a first crystal layer disposed on the first conductive layer side of the piezoelectric layer and a second crystal layer continued from the first crystal layer and disposed nearer to the second conductive layer side than the first crystal layer. In the piezoelectric layer, the lead concentration in the first conductive layer side of the first crystal layer is lower than that in the second conductive layer side of the second crystal layer. In the piezoelectric layer, the oxygen concentration in the first conductive layer side of the first crystal layer is higher than that in the second conductive layer side of the second crystal layer.

In this piezoelectric element, the piezoelectric layer includes the first crystal layer disposed on the first conductive layer side of the piezoelectric layer and the second crystal layer. In the composition of the piezoelectric layer, the lead concentration in the first conductive layer side of the first crystal layer is lower than that in the second conductive layer side of the second crystal layer, and the oxygen concentration in the first conductive layer side of the first crystal layer is higher than that in the second conductive layer side of the second crystal layer. Therefore, the crystal quality of the compound oxide is improved over the entirety of the piezoelectric layer. Thus, the piezoelectric element of this application example has good durability characteristics with respect to at least a displacement.

APPLICATION EXAMPLE 2

In the piezoelectric element of application example 1, the oxygen concentration in the first conductive layer side of the first crystal layer is higher by a range of 4.7 atomic % or more and 8.7 atomic % or less than that in the second conductive layer side of the second crystal layer.

In this piezoelectric element, the crystal quality of the compound oxide is further improved over the entirety of the piezoelectric layer. Thus, the piezoelectric element of this application example has more improved durability characteristics with respect to a displacement.

APPLICATION EXAMPLE 3

In the piezoelectric element of application example 1 or 2, the concentration of each element in the piezoelectric layer is measured using a relative sensitivity factor determined by both Rutherford backscattering spectroscopy and Auger electron spectroscopy.

This piezoelectric element has good durability characteristics.

APPLICATION EXAMPLE 4

In the piezoelectric element of any one of application examples 1 to 3, the total thickness of the first crystal layer and the second crystal layer is 1/20 or more and 1/3 or less of the thickness of the piezoelectric layer.

This piezoelectric element has a crystal control region at a high ratio to the piezoelectric layer, and thus durability characteristics can be improved, and a displacement can be further increased.

APPLICATION EXAMPLE 5

A piezoelectric actuator according to an embodiment of the present invention includes the piezoelectric element described in any one of application examples 1 to 4, and a vibrating plate with flexibility provided in contact with the first conductive layer or the second conductive layer.

This piezoelectric actuator includes the piezoelectric element of any one of the above-described application examples and is thus excellent in durability.

APPLICATION EXAMPLE 6

A liquid ejecting head according to an embodiment of the present invention includes the piezoelectric actuator described in application example 5, and a pressure chamber communicated with a nozzle orifice and changed in volume by an operation of the piezoelectric actuator.

This liquid ejecting head includes the piezoelectric actuator of the above-described application example and is thus excellent in durability.

APPLICATION EXAMPLE 7

A liquid ejecting apparatus according to an embodiment of the present invention includes the liquid ejecting head described in application example 6.

This liquid ejecting apparatus includes the liquid ejecting head of the above-described application example and is thus excellent in durability.

BRIEF DESCRIPTION OF THE DRAWINGS

The invention will be described with reference to the accompanying drawings, wherein like numbers reference like elements.

DESCRIPTION OF EXEMPLARY EMBODIMENTS

A preferred embodiment of the present invention is described with reference to the drawings. The embodiment described below is made for explaining an example of the present invention. In addition, the invention is not limited to the embodiment and includes various modified examples carried out within the scope of the gist.

1. Piezoelectric Element

Figure 1:
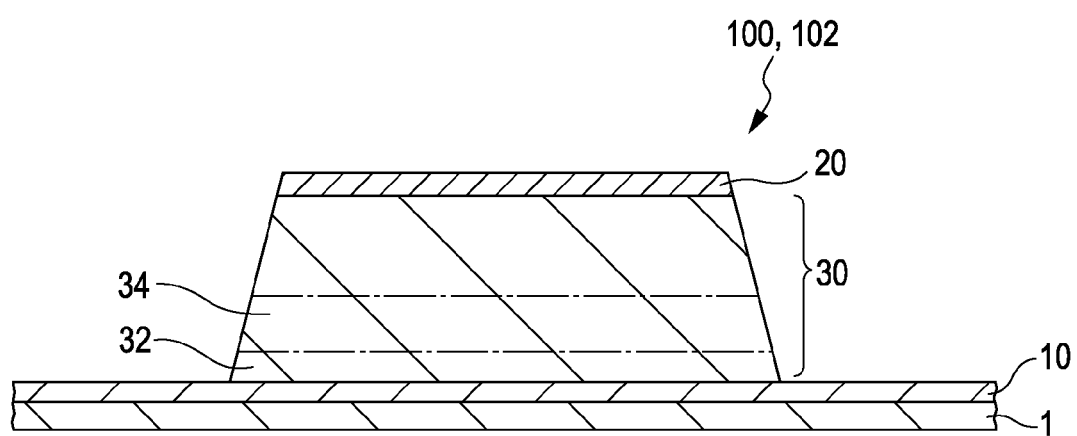
FIG. 1 is a schematic sectional view of a piezoelectric element according to an embodiment of the invention.

FIG. 1 is a schematic sectional view of a piezoelectric element 100 according to an embodiment of the invention.

The piezoelectric element 100 according to the embodiment includes a first conductive layer 10, a second conductive layer 20, and a piezoelectric layer 30.

1.1. First Conductive Layer

The first conductive layer 10 is formed on, for example, a substrate 1. The substrate 1 can be made of a flat plate composed of, for example, a conductor, a semiconductor, or an insulator. The substrate 1 may have a single-layer structure or a structure including a plurality of laminated layers. The internal structure of the substrate 1 is not limited as long as the top surface has a planar shape and, for example, a structure having a space formed therein may be used. For example, as in a liquid ejecting head described below, when a pressure chamber and the like are formed below the substrate 1, the substrate 1 and a plurality of members formed below the substrate 1 may be collectively regarded as one substrate 1.

The substrate 1 may be a vibrating plate with flexibility which can be deformed (bent) by an operation of the piezoelectric layer 30. In this case, the piezoelectric element 100 serves as a piezoelectric actuator 102 including the vibrating plate, the first conductive layer 20, the piezoelectric layer 30, and the second conductive layer 50. The expression "the substrate 1 with flexibility" represents that the substrate 1 can be bent. When the substrate 1 is the vibrating plate, bending of the substrate 1 which is enough to change the volume of the pressure chamber to the same extent as the volume of liquid to be ejected is sufficient for the piezoelectric actuator 102 to be used in a liquid ejecting head.

When the substrate 1 is the vibrating plate, the material of the substrate 1 can be exemplified by inorganic oxides such as zirconium oxide ($ZrO_2$), silicon nitride, silicon oxide, and the like, and alloys such as stainless steel and the like. Among these materials, zirconium oxide is particularly preferred for the material of the substrate (vibrating plate) from the viewpoint of chemical stability and rigidity. In this case, the substrate 1 may have a laminated structure including two or more of the exemplified materials.

In this embodiment, the case in which the substrate 1 is the vibrating plate and is composed of zirconium oxide is described as an example. Therefore, the piezoelectric element 100 is substantially the same as the piezoelectric actuator 102 including the vibrating plate with flexibility which can be deformed (bent) by an operation of the piezoelectric layer 30. Therefore, in the description below, the piezoelectric element 100 and the piezoelectric actuator 102 can be replaced with each other.

The shape of the first conductive layer 10 is not limited as long as it can be opposed to the second conductive layer 20. However, when the piezoelectric element 100 includes a thin film, a layer or a thin film is preferred. In this case, the thickness of the first conductive layer 10 can be, for example, 50 nm or more and 300 nm or less. Also, the planar shape of the first conductive layer 10 is not particularly limited as long as the piezoelectric layer 30 can be disposed between the first conductive layer 10 and the second conductive layer 20 when both layers are opposed to each other. For example, a rectangular shape, a circular shape, or the like can be used.

One of the functions of the first conductive layer 10 is to serve as one (e.g., a lower electrode formed below the piezoelectric layer 30) of the electrodes used for applying a voltage to the piezoelectric layer 30. The first conductive layer 10 may be provided with the function to control crystal orientation when the piezoelectric layer 30 is crystallized.

The material of the first conductive layer 10 can be exemplified by various metals such as nickel, iridium, platinum, and the like; conductive oxides thereof (e.g., iridium oxide and the like); strontium-ruthenium compound oxides (SrRuO$_x$: SRO); lanthanum-nickel compound oxides (LaNiO$_x$: LNO); and the like. The first conductive layer 10 may have a single-layer structure using one of the exemplified materials or a laminated structure using two or more. In addition, for example, an adhesive layer or the like may be formed between the first conductive layer 10 and the substrate 1. In this case, for example, a titanium layer or the like can be used as the adhesive layer.

1.2. Second Conductive Layer

The second conductive layer 20 is disposed to face the first conductive layer 10. The second conductive layer 20 may be entirely or partially opposed to the first conductive layer 10. The shape of the second conductive layer 20 is not limited as long as it can be opposed to the first conductive layer 10. However, when the piezoelectric element 100 includes a thin film, a layer or a thin film is preferred. In this case, the thickness of the second conductive layer 20 can be, for example, 10 nm or more and 300 nm or less. Also, the planar shape of the second conductive layer 20 is not particularly limited as long as the piezoelectric layer 30 can be disposed between the first conductive layer 10 and the second conductive layer 20 when both layers are opposed to each other. For example, a rectangular shape, a circular shape, or the like can be used.

One of the functions of the second conductive layer 20 is to serve as one (e.g., an upper electrode formed on the piezoelectric layer 30) of the electrodes used for applying a voltage to the piezoelectric layer 30. The material of the second conductive layer 20 may be the same as the first conductive layer 10.

FIG. 1 shows an example in which the first conductive layer 10 is formed to have a larger planar size than the second conductive layer 20. However, the second conductive layer 20 may be formed to have a larger planar size than the first conductive layer 10. In this case, the second conductive layer 20 may be formed on the side surface of the piezoelectric layer 30 so that the second conductive layer 20 can also be provided with the function to protect the piezoelectric layer 30 from moisture, hydrogen, and the like.

1.3. Piezoelectric Layer

The piezoelectric layer 30 is disposed between the first conductive layer 10 and the second conductive layer 20. The piezoelectric layer 30 may be in contact with at least one of the first conductive layer 10 and the second conductive layer 20. In addition, another layer may be formed between the piezoelectric layer 30 and at least one of the first conductive layer 10 and the second conductive layer 20. In this case, examples of the other layer include an orientation control layer (e.g., a titanium layer) for controlling the crystal orientation of the piezoelectric layer 30 and the like.

In the example shown in FIG. 1, the piezoelectric layer 30 is provided in contact with the first conductive layer 10 and the second conductive layer 20. The thickness of the piezoelectric layer 30 can be, for example, 100 nm or more and 2000 nm or less. When the thickness of the piezoelectric layer 300 is out of this range, sufficient deformation (electro-mechanical conversion) may not be obtained.

In addition, the piezoelectric layer 30 contains a compound oxide containing at least lead, zirconium, titanium, and oxygen. Examples of the compound oxide contained in the piezoelectric layer 30 include oxides represented by the general formula ABO$_3$ (for example, A contains Pb, and B contains Zr and Ti). More specifically, lead zirconate titanate (Pb(Zr, Ti)O$_3$) (may be abbreviated as "PZT" hereinafter), lead zirconate titanate niobate (Pb(Zr, Ti, Nb)O$_3$) (may be abbreviated as "PZTN" hereinafter), and the like can be used. Any one of these compound oxides can form a solid solution of A-site oxide and B-site oxide in the formula. Further, these compound oxides can take a perovskite crystal structure by crystallization. When the compound oxides take a perovskite crystal structure by crystallization, piezoelectricity can be exhibited. As a result, the piezoelectric layer 30 can be deformed by applying an electric field to the first conductive layer 10 and the second conductive layer 20 (electro-mechanical conversion). This deformation permits, for example, bending and vibration of the substrate 1.

The piezoelectric layer 30 includes a first crystal layer 32 and a second crystal layer 34.

The first crystal layer 32 is formed on the first conductive layer side of the piezoelectric layer 30. The thickness of the first crystal layer 32 is not particularly limited, but is preferably 5 nm or more and 200 nm or less.

The functions of the first crystal layer 32 are to improve crystallinity of the piezoelectric layer 30, to suppress the influence of a member (in this embodiment, the first conductive layer 10) below the piezoelectric layer 30 on the second crystal layer 34, to decrease crystal defects of the piezoelectric layer 30, and the like.

The second crystal layer 34 is continued from the first crystal layer 32 and formed nearer to the second conductive layer 20 than the first crystal layer 32. The thickness of the second crystal layer 34 is not particularly limited, but is preferably 50 nm or more and 2,000 nm or less. The functions of the second crystal layer 34 are to further support the function to improve crystallinity of the piezoelectric layer 30 by the first crystal layer 32, to improve crystallinity of the whole of the piezoelectric layer 30, to decrease crystal defects of the piezoelectric layer 30, and the like.

In addition, the total thickness of the first crystal layer 32 and the second crystal layer 34 may be the same as the thickness of the piezoelectric layer 30. The total thickness of the first crystal layer 32 and the second crystal layer 34 is more preferably $\frac{1}{20}$ or more and $\frac{1}{3}$ or less of the thickness of the piezoelectric layer 30. When the total thickness of the first crystal layer 32 and the second crystal layer 34 is within this range, both the durability and displacement of the piezoelectric element 100 can be more easily improved.

The first crystal layer 32 and the second crystal layer 34 can be formed by, for example, at least one of the method of laminating layers by repeating multiple times application and firing (crystallization) of a raw material when the piezoelectric layer 30 is produced, the method of adding a Ti layer, a Zr layer, a Pb layer, and the like between layers to be laminated by repeating multiple times application and firing (crystallization) of a raw material, and the method of changing the oxygen partial pressure of the firing atmosphere and the firing temperature when the piezoelectric layer 30 is produced. Even when a Ti layer, a Zr layer, and a Pb layer are added to the piezoelectric layer 30 before firing, the material of the piezoelectric layer 30 can become PZT after firing. The composition of PZT crystals formed in a portion where these layers are present before firing fluctuates near the stoichiometric composition.

The first crystal layer 32 and the second crystal layer 34 each contain crystals of a compound oxide, and the crystals are continuously formed at the interface between the first crystal layer 32 and the second crystal layer 34. The composition of the crystals fluctuates at the interface between the first crystal layer 32 and the second crystal layer 34, and the boundary between the first crystal layer 32 and the second crystal layer 34 can be defined by such fluctuation.

In the piezoelectric element 100 of this embodiment, the lead concentration in the first conductive layer side of the first crystal layer 32 in the piezoelectric layer 30 is lower than that in the second conductive layer side of the second crystal layer 34, and the oxygen concentration in the first conductive layer side of the first crystal layer 32 in the piezoelectric layer 30 is higher than that in the second conductive layer side of the second crystal layer 34. Although not shown in the drawings, when the total thickness of the first crystal layer 32 and the second crystal layer 34 is the same as the thickness of the piezoelectric layer 30, the lead concentration in the first conductive layer side of the piezoelectric layer 30 is lower than that in the second conductive layer side of the piezoelectric layer 30, and the oxygen concentration in the first conductive layer side of the piezoelectric layer 30 is higher than that in the second conductive layer side of the piezoelectric layer 30.

A concentration of each element in the piezoelectric layer 30 is measured by analysis in the thickness direction. The analysis in the thickness direction is performed by, for example, Auger spectroscopy analysis (AES), energy dispersive X-ray spectroscopy with a scanning transmission electron microscope (STEM-EDS), electron energy loss analysis with a transmission electron microscope (STEM-EELS, TEM-EELS, or the like), X-ray photoelectron spectroscopy (XPS), secondary ion mass spectrometry (SIMS), or the like. The concentration is indicated as a concentration profile (depth profile) in the thickness direction of the piezoelectric layer 30. In order to enhance quantitativity of analysis in the thickness direction, Rutherford backscattering spectroscopy (RBS) is combined according to demand.

The difference in the oxygen concentration between the first conductive layer side of the first crystal layer 32 and the second conductive layer side of the second crystal layer 34 is more preferably 4.7 atomic % or more and 8.7 atomic % or less because the crystal quality is further improved over the entirety of the piezoelectric layer 30.

1.4. Operation, Advantage, Etc.

The piezoelectric element 100 of this embodiment includes the first crystal layer 32 and the second crystal layer 34 which are formed on the first conductive layer side of the piezoelectric layer 30. In addition, the lead concentration in the first conductive layer side of the first crystal layer 32 in the piezoelectric layer 30 is lower than that in the second conductive layer side of the second crystal layer 34, and the oxygen concentration in the first conductive layer side of the first crystal layer 32 in the piezoelectric layer 30 is higher than that in the second conductive layer side of the second crystal layer 34. Therefore, crystallinity of the compound oxide is improved over the whole of the piezoelectric layer 30. As a result, a displacement of the piezoelectric element 100 can be increased, and the operation characteristics can be improved. In addition, the piezoelectric element 100 of this embodiment has good crystallinity in the piezoelectric layer 30 and is thus excellent in durability when driven repeatedly.

2. Method for Manufacturing Piezoelectric Element

The piezoelectric element of the present invention can be manufactured, for example, as described below.

First, the substrate 1 is prepared, and the first conductive layer 10 is formed on the substrate 1. The first conductive layer 10 can be formed by, for example, sputtering, plating, vacuum evaporation, or the like. The first conductive layer 10 can be patterned according to demand.

Next, the piezoelectric layer 30 is formed on the first conductive layer 10. The piezoelectric layer 30 can be formed by, for example, a sol-gel method, a CVD (Chemical Vapor Deposition) method, a MOD (Metal Organic Deposition) method, a sputtering method, a laser abrasion method, or the like. For example, when the material of the piezoelectric layer 30 is PZT, the piezoelectric layer 30 can be crystallized by firing at about 650° C. to 750° C. in an oxygen atmosphere. The crystallization may be performed after patterning of the piezoelectric layer 30.

In this embodiment, the piezoelectric layer 30 is formed by repeating the above-mentioned operation at least two times. This method can form the first crystal layer 32 and the second crystal layer 34. Consequently, crystallinity and crystal quality can be improved over the whole of the piezoelectric layer 30. The first crystal layer 32 is formed in contact with the first conductive layer 10, and the second crystal layer 34 is formed by the above-described operation for a second layer. In this embodiment, the above-described operation is further performed to form the piezoelectric layer 30, but the second crystal layer indicates the second layer formed to continue from the first crystal layer 32.

Next, the second conductive layer 20 is formed on the piezoelectric layer 30. The second conductive layer 20 can be formed by, for example, sputtering, plating, vacuum evaporation, or the like. Then, the second conductive layer 20 and the piezoelectric layer 30 are patterned in a desired shape to form the piezoelectric element. The second conductive layer 20 and the piezoelectric layer 30 can be simultaneously patterned according to demand. The piezoelectric element of the present invention can be manufactured by the above-exemplified process.

3. Experimental Example and Reference Example

The present invention is described in further detail below by experimental examples and a reference example. The present invention is not limited to the experimental examples described below.

3.1. Formation of Piezoelectric Element

A piezoelectric element of each of the experimental examples and the reference example was formed as follows. First, a silicon substrate was prepared, and the first conductive layer 10 was formed by sputtering iridium and then patterned. The piezoelectric layer 30 of each of the experimental examples was formed by a sol-gel method. A raw material solution of PZT was applied to the first conductive layer 10 by a spin coating method. The raw material solutions of the experimental examples had different compositions. In addition, spin coating included edge rinsing with a main solvent and was performed at a spin speed of 1,500 rpm.

The applied raw material solution was dried at 100° C. for 3 minutes and 160° C. for 3 minutes in air to remove the solvent. Then, the organic components in the raw material solution were removed (degreased) by heat treatment at 400° C. for 3 minutes in air. In addition, a first layer (first crystal layer 32) of the piezoelectric layer composed of PZT was formed by firing at 740° C. for 5 minutes in an oxygen atmosphere. At this time, in each of the experimental examples, the thickness of the first crystal layer 32 after firing was about 130 nm. Then, the second piezoelectric layer (second crystal layer 34) was formed on the first crystal layer 32 by the same method as described above. The same operation was performed for the third and latter layers. The thickness of the second piezoelectric layer and the latter was about 300 nm. Therefore, the total thickness of the first crystal layer 32 and the second crystal layer 34 was about 430 nm. As a result, a total of 5 layers were laminated to form the crystallized piezoelectric layer 30. The overall thickness of the piezoelectric layer 30 was about 1,330 nm.

Then, the second conductive layer 20 was deposited by sputtering iridium, and the second conductive layer 20 and the piezoelectric layer 30 were patterned to form the piezoelectric element of each of Experimental Examples 1 and 2.

The raw material solution used in the sol-gel method was a mixed solution containing lead acetate, $Zr(CH_3COCHCOCH_3)_4$, and $Ti[OCH(CH_3)_2]_4$, and butyl cellosolve was used as a solvent. The composition of the raw material solution of each experimental example is shown as the concentration of an element contained in the raw material solution in the column "Concentration (charge amount) of each element in raw material" in Table 1.

TABLE 1

|  |  | Experimental Example 1 | Experimental Example 2 | Reference Example |
|---|---|---|---|---|
| Concentration (charging amount) of each element in raw material | Pb | 22.8 | 24.2 | 21.2 |
|  | Zr | 10 | 9.8 | 10.2 |
|  | Ti | 9.3 | 9.1 | 9.5 |
|  | O | 57.9 | 56.8 | 59.1 |
| Pb excess amount of piezoelectric layer (normalized by stoichiometric ratio) |  | 0.18 | 0.28 | 0.08 |
| Concentration of each element on first electrode side (A) of first crystal layer | Pb | 14.9 | 21.8 | 0 |
|  | Zr | 2 | 3.3 | 0 |
|  | Ti | 17.1 | 14 | 33.3 |
|  | O | 66 | 60.9 | 66.6 |
| Concentration of each element on second electrode side (B) of second crystal layer | Pb | 24.7 | 26.8 | 0 |
|  | Zr | 10.6 | 11.9 | 33.3 |
|  | Ti | 7.3 | 5.1 | 0 |
|  | O | 57.3 | 56.2 | 66.6 |
| Difference in oxygen concentration between first conductive layer side (A) of first crystal layer and second conductive layer side (B) of second crystal layer |  | 8.7 | 4.7 | 0 |
| Remarks |  | RBS/AES | RBS/AES | STEM-EDS |

In Experimental Example 1, the excess amount of lead atoms in the raw material solution of the piezoelectric layer 30 is 18%. The term "excess amount" represents an excess amount mixed over a lead fraction (concentration) which is regarded as 1 (100%) in the stoichiometric composition, i.e., $Pb(Zr, Ti)O_3$, when PZT takes an ideal perovskite structure. Namely, in Experimental Example 1, the piezoelectric layer 30 is formed using the raw material solution having a number of lead atoms contained which was 18% larger than the total number of Zr atoms and Ti atoms. Similarly, in Experimental Example 2, the excess amount of lead atoms in the raw material solution of the piezoelectric layer 30 is 28%. In Reference Example, the excess amount of lead atoms in the raw material solution of the piezoelectric layer 30 is 8%. Hereinafter, the excess amount of Pb atoms in the raw material solution is simply referred to as the "Pb excess amount".

3.2 Analysis of Piezoelectric Layer

Figure 2:
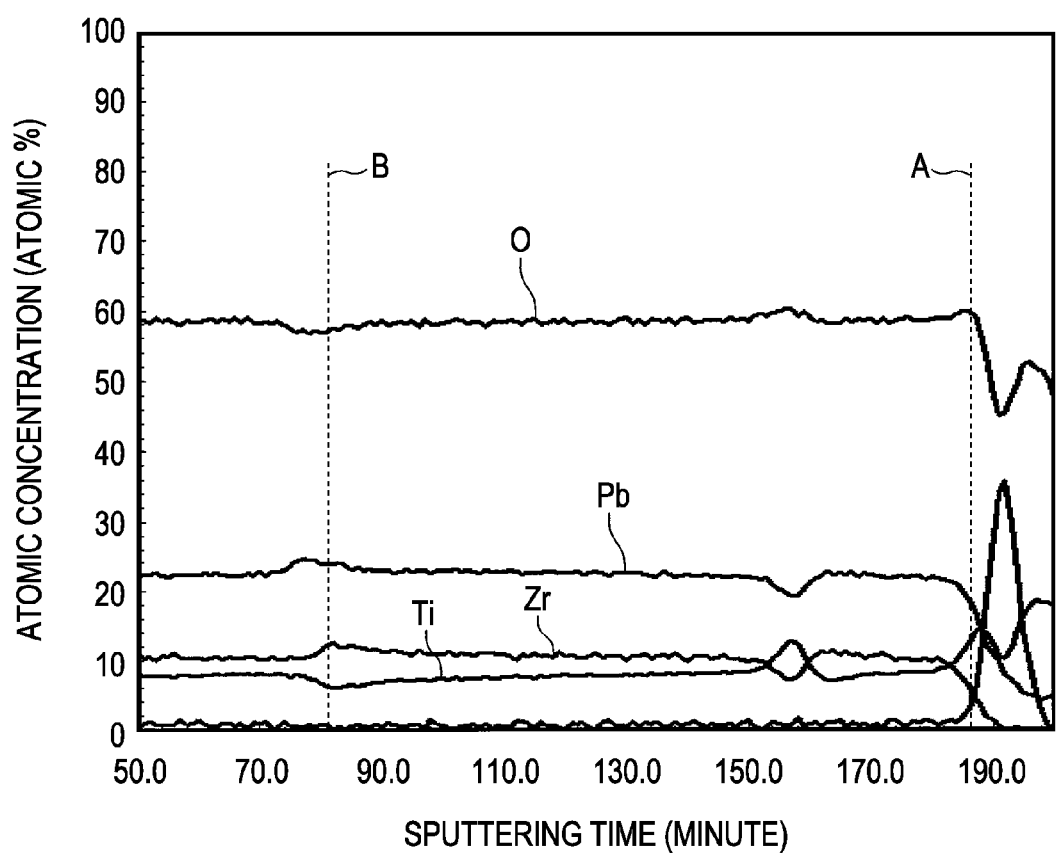
FIG. 2 is a RBS/AES depth profile of Experimental Example 1.
Figure 3:
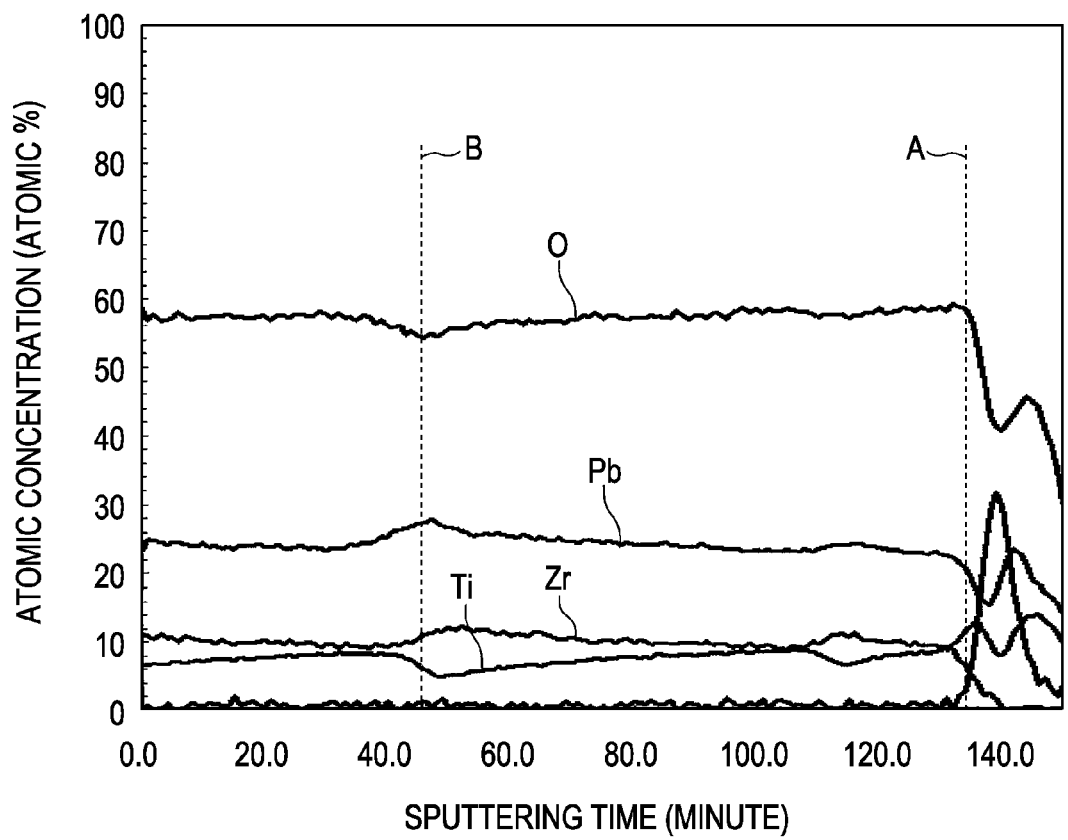
FIG. 3 is a RBS/AES depth profile of Experimental Example 2.

FIGS. 2 and 3 are depth profiles based on the results of RBS (Rutherford Backscattering Spectroscopy)/AES (Auger Electron Spectroscopy) measurement of the vicinities of the interfaces between the first conductive layers 10 and the piezoelectric layers 30 of the piezoelectric elements of Experimental Examples 1 and 2, respectively. The RBS method can produce a quantitative composition distribution in the depth direction without requiring a standard sample. However, it is difficult, only by the RBS method, to measure a thickness (in this electrode configuration, the PZT limit thickness is about 100 nm) and determine a composition distribution near an interface with an electrode. Therefore, in each of the experimental examples, a relative sensitivity factor is determined by combination of AES with high depth resolution and RBS with high quantitative accuracy so that both the abscissa (depth resolution) and the ordinate (quantitative accuracy) are satisfied. The relative sensitivity factor is a value normalized with respect to an average peak intensity of an AES stable region (little influence of selective etching) and a composition ratio determined by RBS. This method cannot determine a composition profile using each of the elements alone but requires the peak intensities and relative sensitivity factors of all elements, thereby producing a relative concentration profile. A concentration profile in the depth direction of a PZT thick film (about 500 nm) was determined by applying the relative sensitivity factors determined for PZT near the interface between the first conductive layer 10 and the piezoelectric layer 30 on the basis of the following equation 1:

Concentration of element $A$=(peak intensity of element $A$/relative sensitivity factor)/$\Sigma$(peak intensity of each element/relative sensitivity factor)×100   (1)

According to the depth profile of each of the elements shown in FIGS. 2 and 3, it is found that the concentration of each element changes at the interface between the piezoelectric layer 30 and the first conductive layer 10 (the first conductive layer side of the first crystal layer 32) (denoted by symbol A in the drawings, and may be referred to as "interface A" hereinafter), the interface between the first crystal layer 32 and the second crystal layer 34, and the interface between the second crystal layer 34 and the piezoelectric layer 30 adjacent thereto on the second conductive layer side (the second conductive layer side of the second crystal layer 34) (denoted by symbol B in the drawings, and may be referred to as "interface B" hereinafter).

On the basis of the resulting profiles (FIGS. 2 and 3), the concentrations of each of the elements at the interface A and the interface B in the piezoelectric element of each of Experimental Examples 1 and 2 were measured. These measurements correspond to the compositions at the positions on the first conductive layer side of the first crystal layer 32 and the second conductive layer side of the second crystal layer 34.

The results shown in Table 1 indicate that in both Experimental Examples 1 and 2, the lead concentration in the first conductive layer side (interface A) of the first crystal layer 32 is lower than that in the second conductive layer side (interface B) of the second crystal layer 34, and the oxygen concentration in the first conductive layer side (interface A) of the first crystal layer 32 is higher than that in the second conductive layer side (interface B) of the second crystal layer 34. Specifically, in Experimental Example 1, the lead concentration in the first conductive layer side of the first crystal layer 32 is 14.9 atomic %, and the lead concentration in the second conductive layer side of the second crystal layer 34 is 24.7 atomic %. With respect to the oxygen concentration in the piezoelectric layer 30, the oxygen concentration in the first conductive layer side of the first crystal layer 32 is 66 atomic %, and the oxygen concentration in the second conductive layer side of the second crystal layer 34 is 57.3 atomic %. In addition, in Experimental Example 2, the lead concentration in the first conductive layer side of the first crystal layer 32 is 21.8 atomic %, and the lead concentration in the second conductive layer side of the second crystal layer 34 is 26.8 atomic %. With respect to the oxygen concentration in the piezoelectric layer 30, the oxygen concentration in the first conductive layer side of the first crystal layer 32 is 60.9 atomic %, and the oxygen concentration in the second conductive layer side of the second crystal layer 34 is 56.2 atomic %.

In Reference Example, the lead concentration in the first conductive layer side of the first crystal layer 32 is 0 atomic %, and the lead concentration in the second conductive layer side of the second crystal layer 34 is 0 atomic %. With respect to the oxygen concentration in the piezoelectric layer 30, the oxygen concentration in the first conductive layer side of the first crystal layer 32 is 66.6 atomic %, and the oxygen concentration in the second conductive layer side of the second crystal layer 34 is 66.6 atomic %. Therefore, the piezoelectric element of Reference Example does not have the relation that the lead concentration in the first conductive layer side of the first crystal layer 32 is lower than that in the second conductive layer side of the second crystal layer 34, and the oxygen concentration in the first conductive layer side of the first crystal layer 32 is higher than that in the second conductive layer side of the second crystal layer 34. In Reference Example, quantitativity of EDS for the compound oxide was corrected on the basis of the quantitative values determined by RBS/AES in the experimental examples.

Also, Table 1 indicates that in both Experimental Examples 1 and 2, the relative ratio of each of the elements of PZT varies with the Pb excess amount at the time of charging. Namely, as the Pb excess amount increases from 18% to 28%, the ratio (Zr/Ti) of zirconium to titanium on the second conductive layer side (interface B) of the second crystal layer 34 increases from 1.5 to 2.3 (+53%), and the composition other than Pb is also influenced. In addition, the Pb excess amount at the time of charging also influences the oxygen concentration. In Experimental Examples 1 and 2, the differences in oxygen concentration between the first conductive layer side (interface A) of the first crystal layer 32 and the second conductive layer side (interface B) of the second crystal layer 34 are 8.7 atomic % and 4.7 atomic %, respectively.

Figure 4:
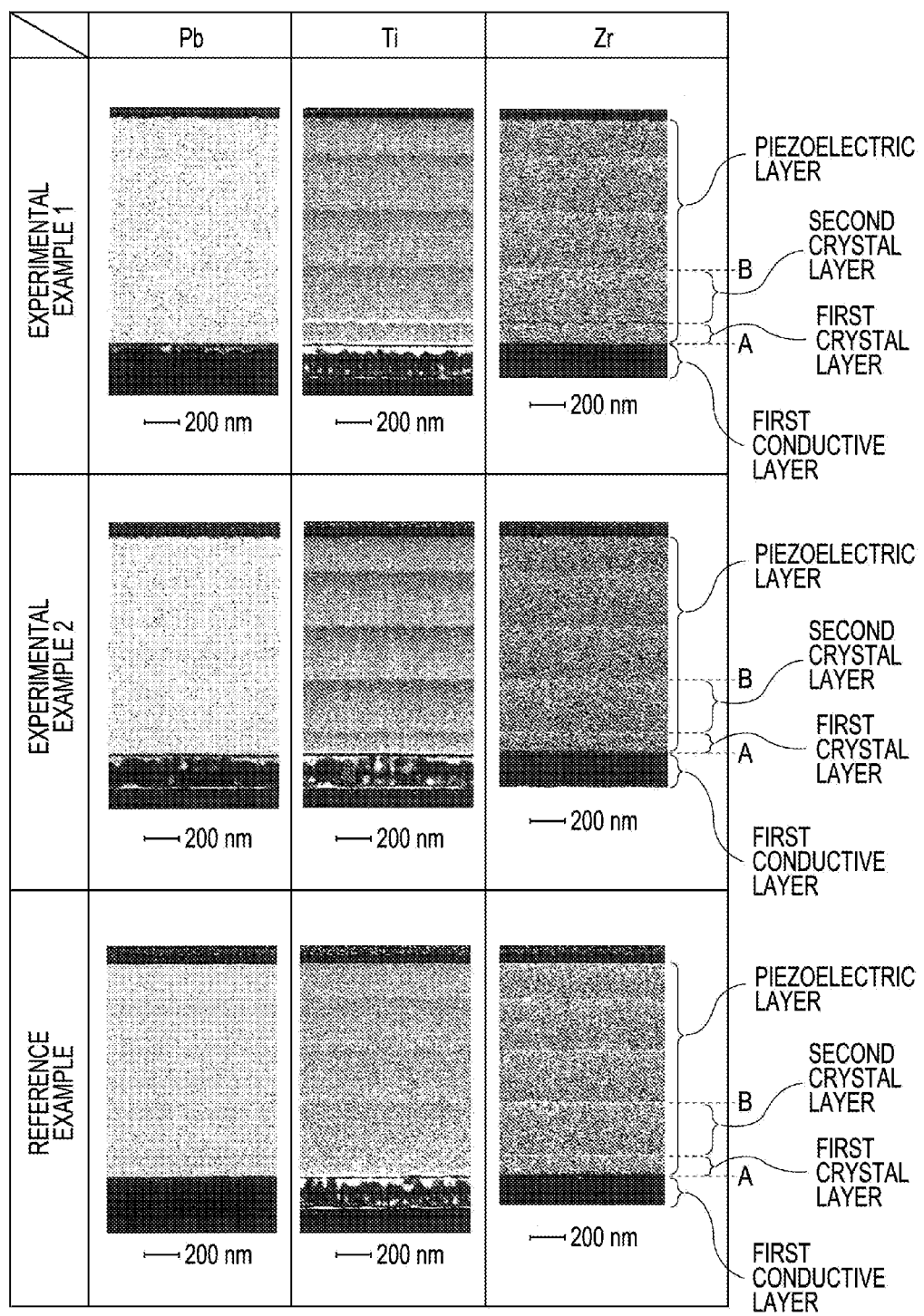
FIG. 4 is a STEM-EDS map image showing sectional compositions of experimental examples and a reference example.

FIG. 4 shows map images of the sectional compositions obtained by STEM (Scanning Transmission Electron Microscope)-EDS (Energy Dispersive X-Ray Spectroscopy) analysis for Pb excess amounts of 8% (Reference Example), 18% (Experimental Example 1), and 28% (Experimental Example 2). FIG. 4 indicates that a periodic concentration distribution of each of the elements occurs in the layers of the piezoelectric layer during firing. In particular, with the Pb excess amount of 8% (Reference Example), Pb diffusion in the first conductive layer 10 is not observed, and segregation of $ZrO_2$ (relative dielectric constant of about 50) without Pb solid solution is observed on the second conductive layer side (interface B) of the second crystal layer 34. Further, segregation of rutile-type $TiO_2$ (relative dielectric constant of about 100) without Pb solid solution is observed at the interface between the piezoelectric layer 30 and the first conductive layer 10 (the first conductive layer side of the first crystal layer 32) (interface A). The PZT composition of Reference Example determined by STEM-EDS is described according to Table 1. In addition, the map image of each of the elements Reference Example determined by STEM-EDS is shown according to Table 1.

Figure 5:
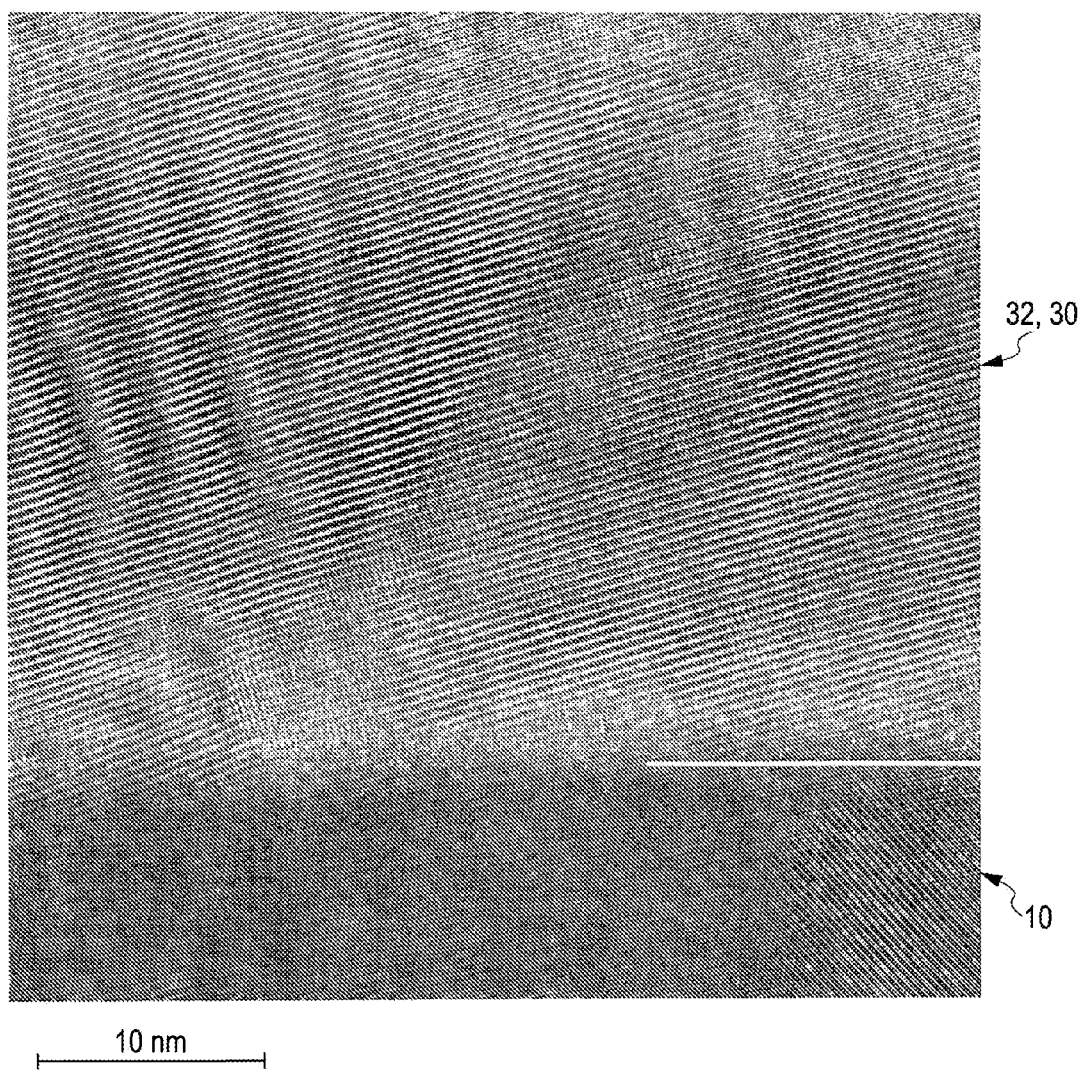
FIG. 5 is a high-resolution TEM image of Experimental Example 1.
Figure 6:
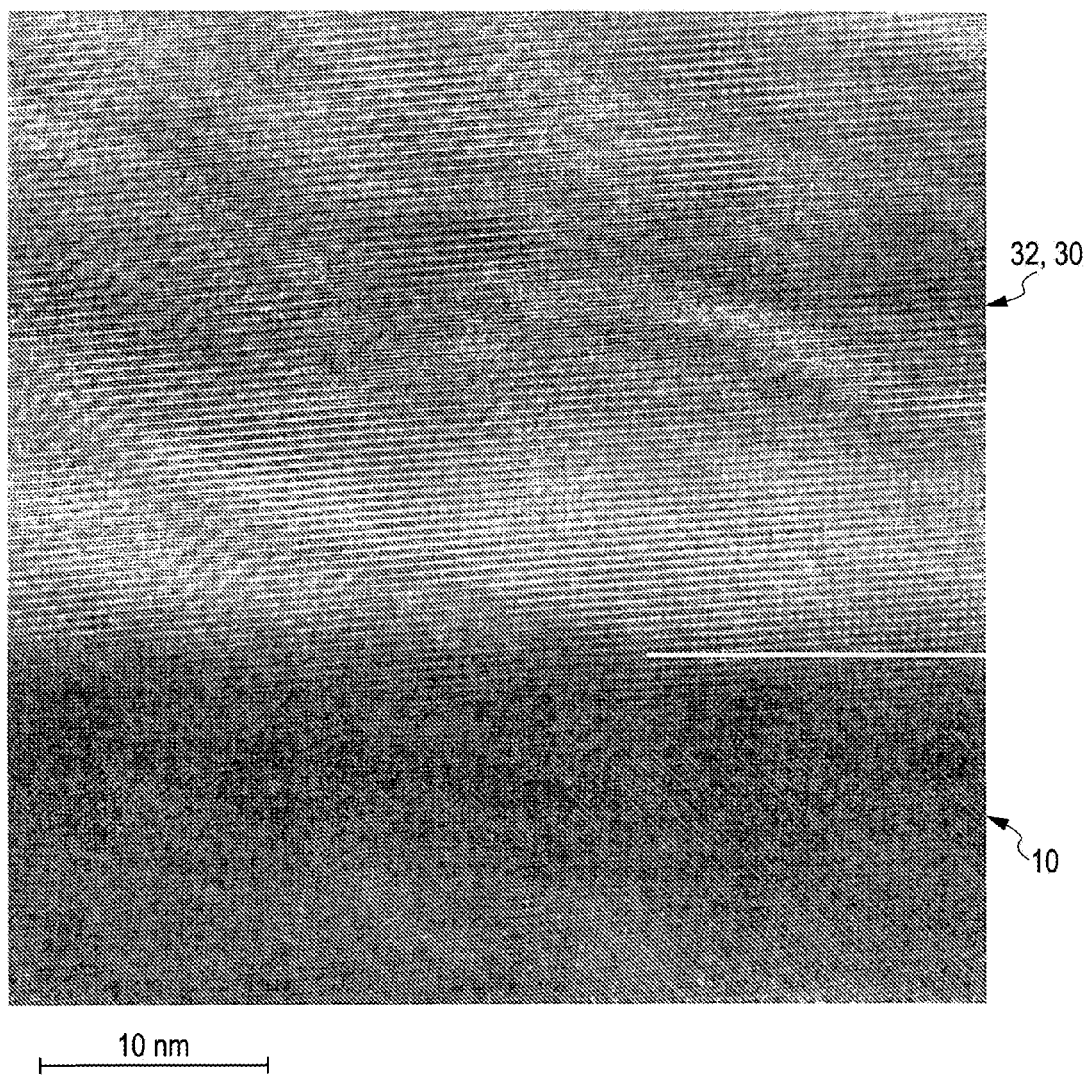
FIG. 6 is a high-resolution TEM image of Experimental Example 2.
Figure 7:
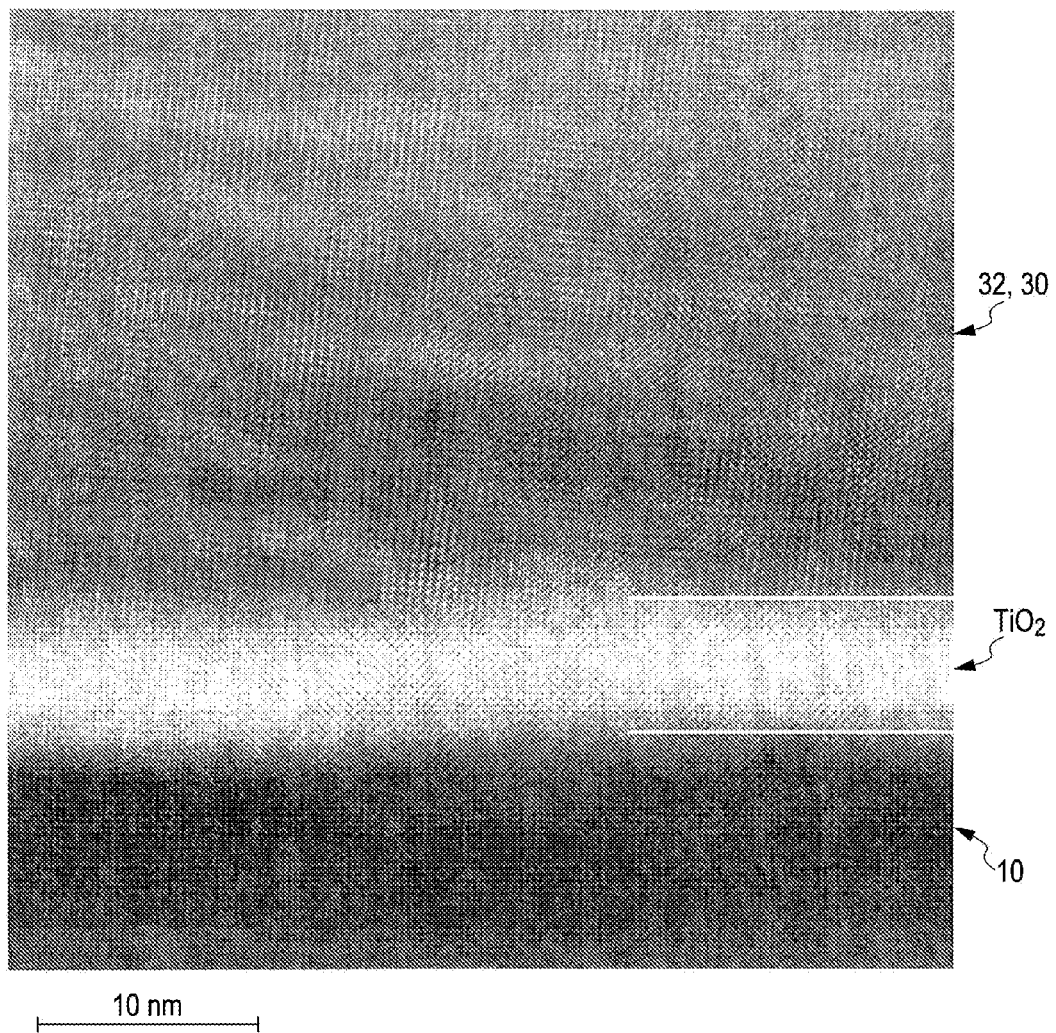
FIG. 7 is a high-resolution TEM image of a reference example.

FIGS. 5 to 7 show the results of high-resolution TEM observation of sections near the interfaces between the first conductive layers 10 and the piezoelectric layers 30 (first crystal layers 32) in the piezoelectric elements of Experimental Example 1, Experimental Example 2, and Reference Example. FIGS. 5 and 6 indicate that with Pb excess amounts of 18% (Experimental Example 1) and 28% (Experimental Example 2), Pb is sufficiently supplied near the interface (interface A) between the first conductive layer 10 and the piezoelectric layer 30 (first crystal layer 32), and a good perovskite structure is formed near the interface without forming a heterogeneous layer. On the other hand, FIG. 7 indicates that with the Pb excess amount of 8% (Reference Example), Pb is not sufficiently supplied near the interface between the first conductive layer 10 and the piezoelectric layer 30 (first crystal layer 32), and segregation of rutile-type $TiO_2$ (relative dielectric constant of about 100) is recognized.

3.3. Evaluation of Piezoelectric Element

Figure 8:
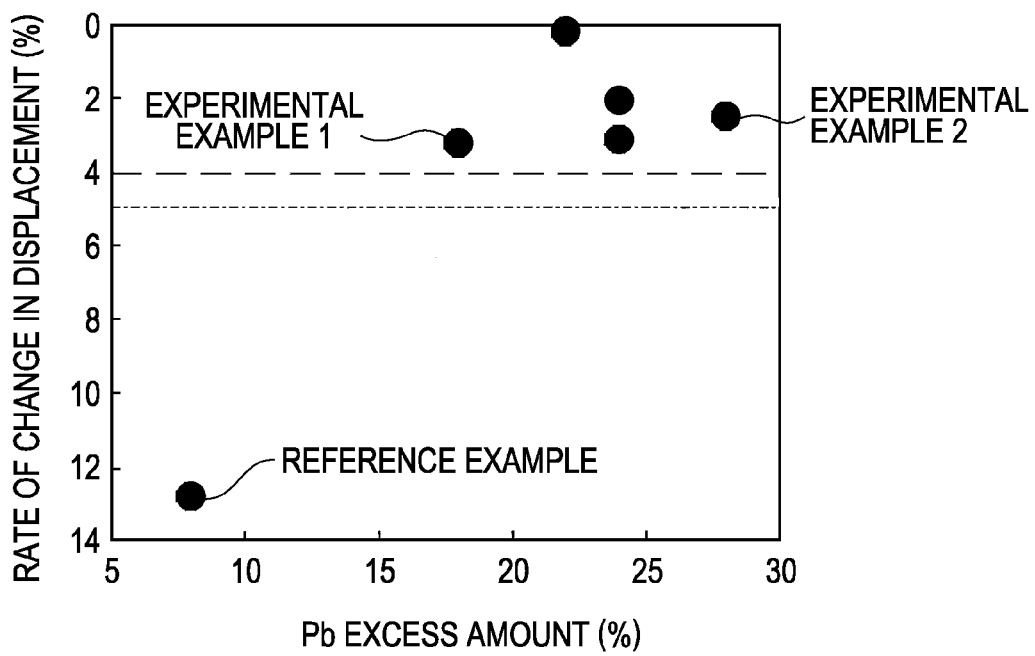
FIG. 8 is a graph showing a relation between Pb excess amounts and changes in displacement.

FIG. 8 shows a relation between Pb excess amounts and rates of change in displacement. This relation was made by plotting, against the Pb excess amounts, the rates of change in displacement determined after 100 million applications of a pulse (rectangular wave from −2 V to +30 V when the first conductive layer 10 was set at a minus potential, and the second conductive layer 20 was set at a plus potential) relative to the displacement immediately after the formation of the piezoelectric element. With a lower rate of change, the piezoelectric element is considered to have higher durability.

FIG. 8 indicates that the rate of change is suppressed to 4% or less within the range of the Pb excess amount of at least 18% or more (denoted by Experimental Example 1 in FIG. 8). It is also found that with the Pb excess amount of 28% in Experimental Example 2, the rate of change is suppressed to 3% or less. For example, when a rate of change of 5% is regarded as a standard value, it is found that within the range of the Pb excess amount of 18% or more, the standard can be sufficiently satisfied. Also, FIG. 8 indicates that in the piezoelectric element having an optimum Pb excess amount of 22%, the rate of change is suppressed to 0.2%.

Figure 9:
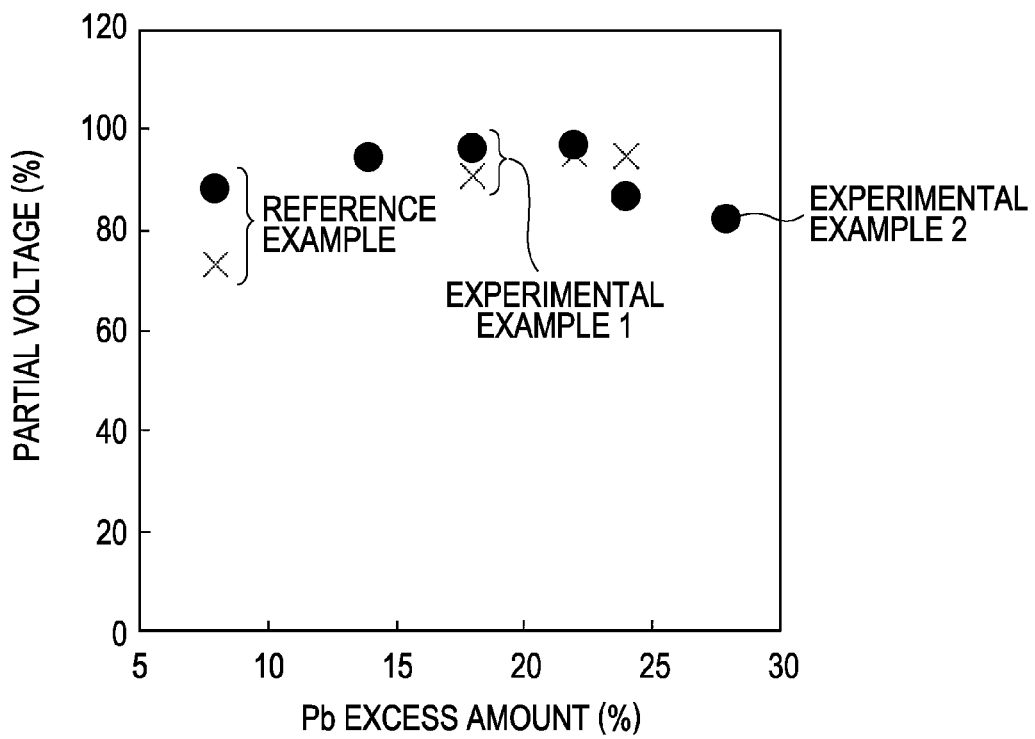
FIG. 9 is a graph showing a relation between Pb excess amounts and partial voltage.

FIG. 9 is a graph obtained by plotting, against Pb excess amounts, the ratio (partial voltage) of arrival of the voltage applied to the piezoelectric layer 30 from the outside. FIG. 9 shows plots of the partial voltage (shown by a filled circle mark in the graph) immediately after the formation of the piezoelectric element and the partial voltage (shown by a cross mark in the graph) after 100 million applications of pulse (rectangular wave from −2 V to +30 V when the first conductive layer 10 was set at a minus potential, and the second conductive layer 20 was set at a plus potential). It is found that with the Pb excess amount of 18% (Experimental Example 1), a decrease of partial voltage of 5.5% is observed before and after the durability test, while with the Pb excess amount of 8% (Reference Example), the partial voltage is significantly decreased, and a decrease of partial voltage of about 16.8% is produced. The results of the reference example are possibly due to the fact that the partial voltage is decreased by concentration of an electric field in a layer with a lower dielectric constant due to the lower Pb concentration in PZT than the stoichiometric composition (20 atomic %). A rutile-type $TiO_2$ layer can be considered as the layer with lower dielectric constant on the basis of the results of high-resolution TEM observation shown in FIG. 7.

Figure 10:
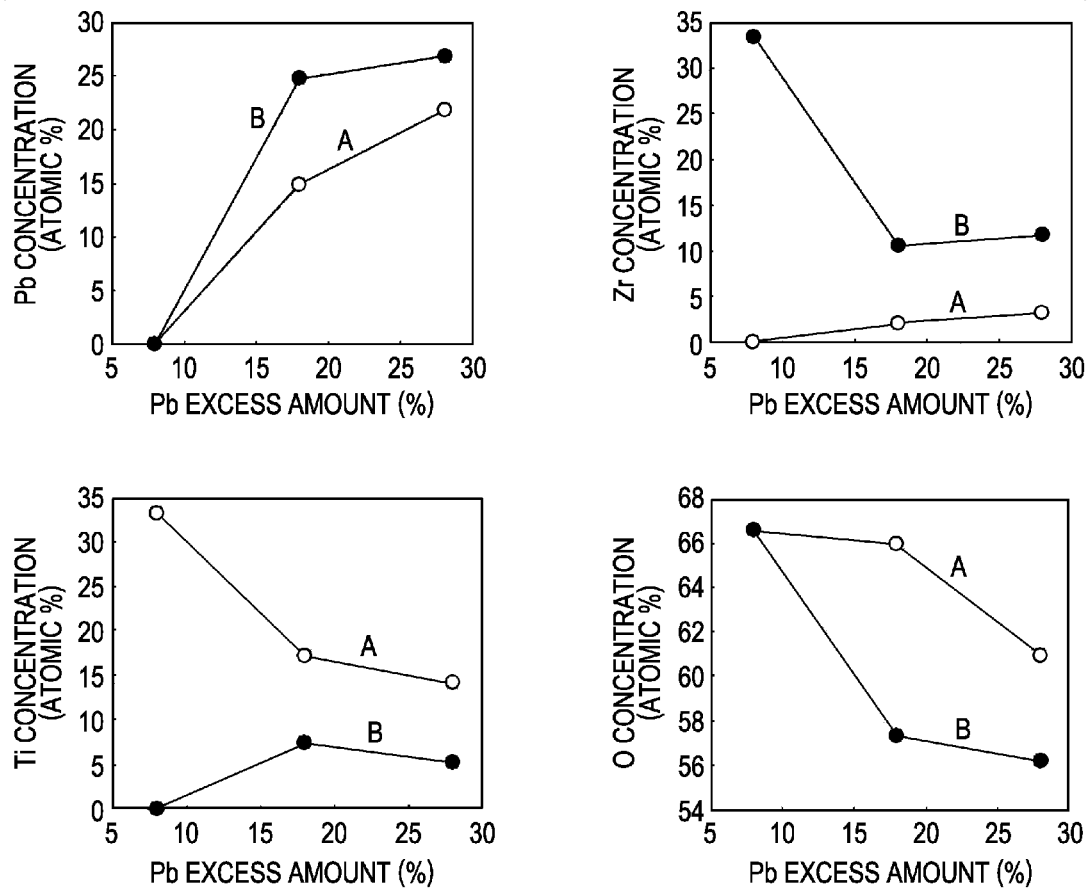
FIG. 10 is a graph showing a relation between Pb excess amounts and changes in the concentration of each element.

FIG. 10 shows a graph obtained by plotting, against Pb excess amounts, the concentration of each of the elements at the interface (interface A) between the piezoelectric layer 30 and the first conductive layer 10 (the first conductive layer side of the first crystal layer 32) and the second conductive layer side (interface B) of the second crystal layer 34. With the Pb excess amount of 8% (Reference Example), $TiO_2$ segregates at the interface A, and $ZrO_2$ segregates at the interface B, forming a low-dielectric-constant layer. This is considered to contribute to the high rate of change in displacement (refer to FIG. 8) and the low partial voltage (refer to FIG. 9) of the piezoelectric element of the reference example. In addition, with the Pb excess amounts of 18% (Experimental Example 1) and 28% (Experimental Example 2), a heterogeneous layer is not formed at the interfaces (refer to FIGS. 5 and 6).

In the experimental examples and the reference example, in order to examine durability, the lead and oxygen concentrations in the first crystal layer 32 and the second crystal layer 34 were changed by changing the Pb excess amount. The conditions of the first crystal layer 32 and the second crystal layer 34 can be changed by changing the firing temperature, interposing another layer such as a titanium layer or the like, or changing the material of the first conductive layer 10 and the second conductive layer 20. Further, although, in the analysis results of the experimental examples and the reference example, a clear boundary was present between the first crystal layer 32 and the second crystal layer 34, a clear boundary may not be necessarily present between both layers.

The piezoelectric element of the present invention does not depend on the conditions for forming the first crystal layer 32 and the second crystal layer 34. Namely, even when the piezoelectric layer 30 is formed by any method, the piezoelectric element of the present invention can exhibit the above-described operation and advantage as long as the piezoelectric layer 30 includes the first crystal layer 32 and the second crystal layer 34 and has the above-mentioned concentration relationships.

4. Liquid Ejecting Head

Figure 11:
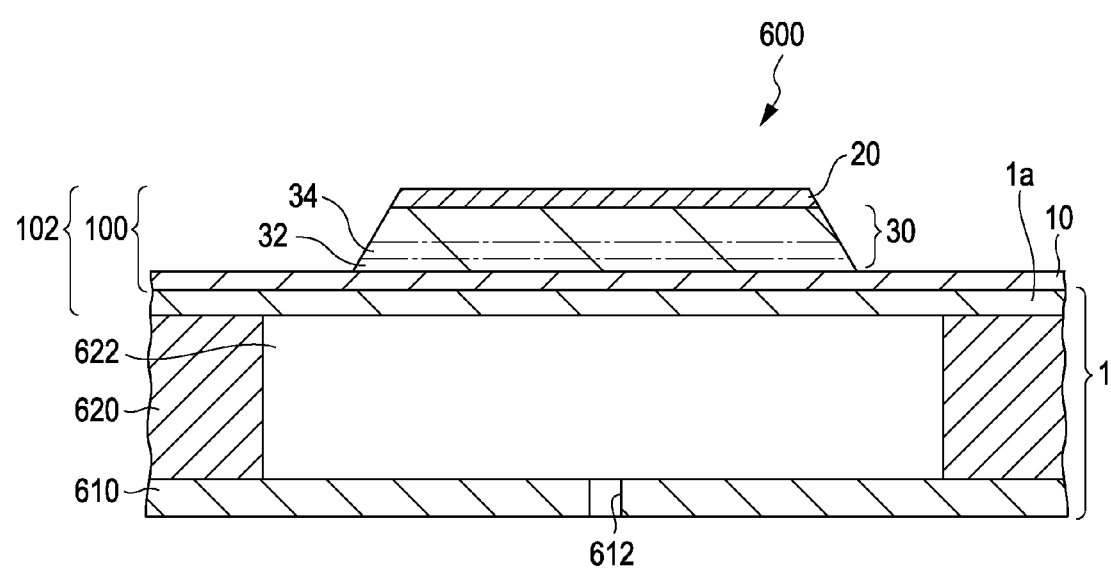
FIG. 11 is a schematic sectional view of a principal portion of a liquid ejecting head according to an embodiment of the invention.
Figure 12:
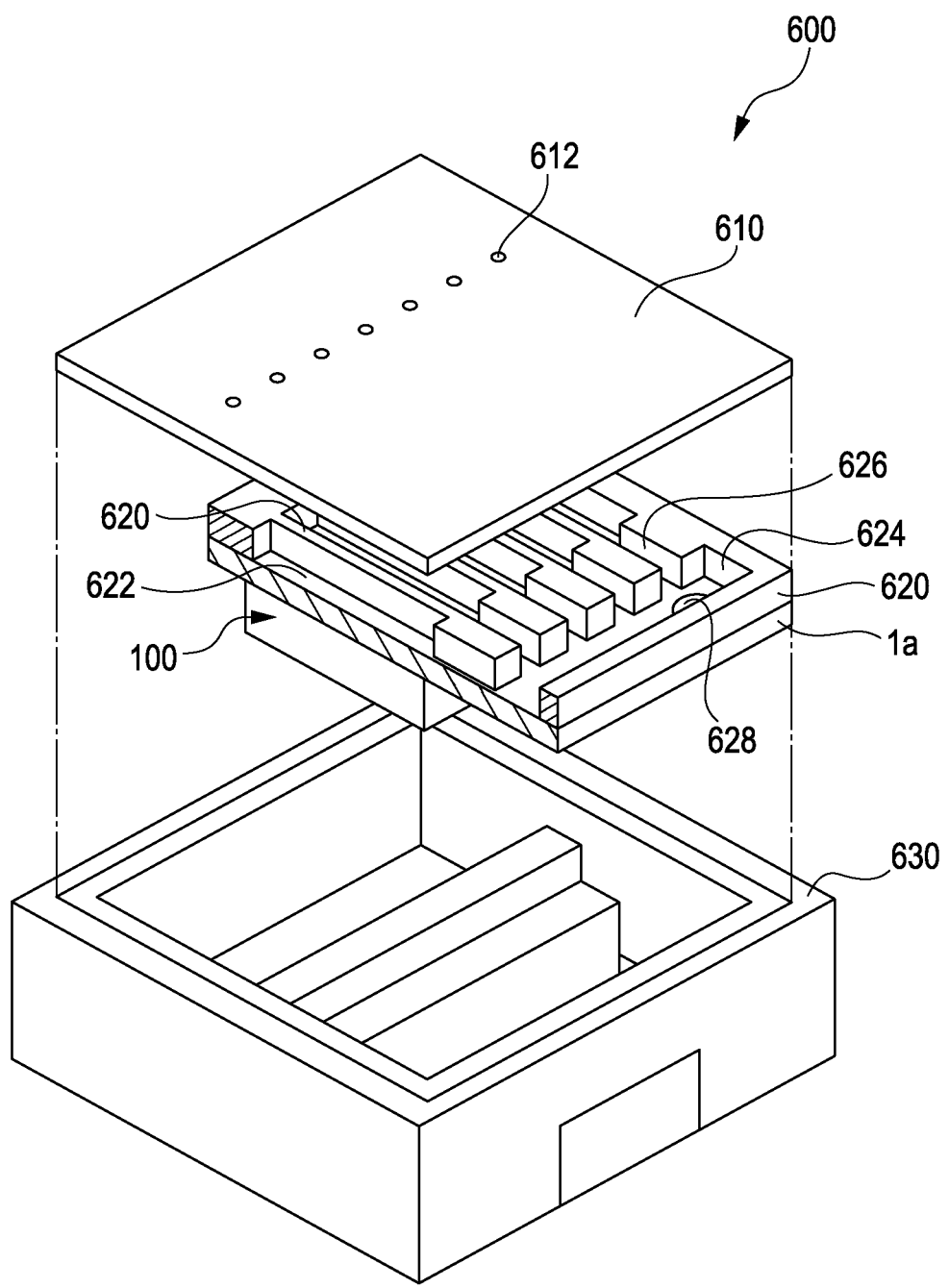
FIG. 12 is an exploded perspective view schematically showing a liquid ejecting head according to an embodiment of the invention.

Next, a liquid ejecting head 600 including the piezoelectric element according to the present invention which functions as a piezoelectric actuator is described with reference to the drawings. FIG. 11 is a schematic sectional view of a principal portion of the liquid ejecting head 600. FIG. 12 is an exploded perspective view showing the liquid ejecting head 600 in an upside-down state of normal operation.

The liquid ejecting head 600 can include the above-described piezoelectric element (piezoelectric actuator). In an example below, the liquid ejecting head 600 is described, in which the piezoelectric element 100 is formed on the substrate 1 (structure including an upper portion serving as a vibrating plate 1a) to serve as the piezoelectric actuator 102.

As shown in FIGS. 11 and 12, the liquid ejecting head 600 includes a nozzle plate 610 having nozzle orifices 612, a pressure chamber substrate 620 for forming pressure chambers 622, and the piezoelectric element 100. As shown in FIG. 12, the liquid ejecting head 600 can further include a casing 630. In FIG. 12, the piezoelectric element 100 is simplified.

The nozzle plate 610, as shown in FIGS. 11 and 12, includes the nozzle orifices 612. An ink can be ejected from the nozzle orifices 612. In the nozzle plate 610, for example, many nozzle orifices 612 are provided in a line. As the material of the nozzle plate 610, for example, silicon, stainless steel (SUS), or the like can be used.

The pressure chamber substrate 620 is provided on the nozzle plate 610 (below the nozzle plate 610 in the example shown in FIG. 12). The material of the pressure chamber substrate 620 can be exemplified by silicon or the like. The space between the nozzle plate 610 and the vibrating plate 1a is partitioned by the pressure chamber substrate 620 to provide a reservoir (liquid storing portion) 624, supply ports 626 communicated with the reservoir 624, and the pressure chambers 622 communicated with the supply ports 626 as shown in FIG. 12. In other words, the reservoir 624, the supply ports 626, and the pressure chambers 622 are partitioned by the nozzle plate 610, the pressure chamber substrate 620, and the vibrating plate 1a. The reservoir 624 can temporarily store the ink supplied from the outside (e.g., an ink cartridge) through a through hole 628 provided in the vibrating plate 1a. The ink in the reservoir 624 can be supplied to the pressure chambers 622 through the supply ports 626. The pressure chambers 622 are changed in volume by deformation of the vibrating plate 1a. The pressure chambers 622 are communicated with the nozzle orifices 612 so that the ink or the like is ejected from the nozzle orifices 612 by changes in volume of the pressure chambers 622.

The piezoelectric element 100 is provided on the pressure chamber substrate 620 (in the example shown in FIG. 12, below the pressure chamber substrate 620). The laminated structure of the piezoelectric element 100 is electrically connected to a piezoelectric element driving circuit (not shown) so as to permit operations (vibration, deformation) on the basis of signals from the piezoelectric element driving circuit. The vibrating plate 1a is deformed by the operation of the laminated structure (the piezoelectric layer 30) so that the pressure in the pressure chambers 622 can be appropriately changed.

As shown in FIG. 12, the casing 630 can house the nozzle plate 610, the pressure chamber plate 620, and the piezoelectric element 100. As the material of the casing 630, for example, a resin, a metal, or the like can be used.

The liquid ejecting head 600 includes the piezoelectric element 100 having the piezoelectric layer 30 with good crystallinity. Therefore, the liquid ejecting head 600 has high durability.

The case in which the liquid ejecting head 600 is an ink jet recording head is described above. However, the liquid ejecting head of the present invention can also be used as a colorant ejecting head used for producing color filters of a liquid crystal display and the like, an electrode material ejecting head used for forming electrodes of an organic EL display, FED (surface emission display), and the like, a bio-organic ejecting head used for producing bio-chips, and the like.

5. Liquid Ejecting Apparatus

Figure 13:
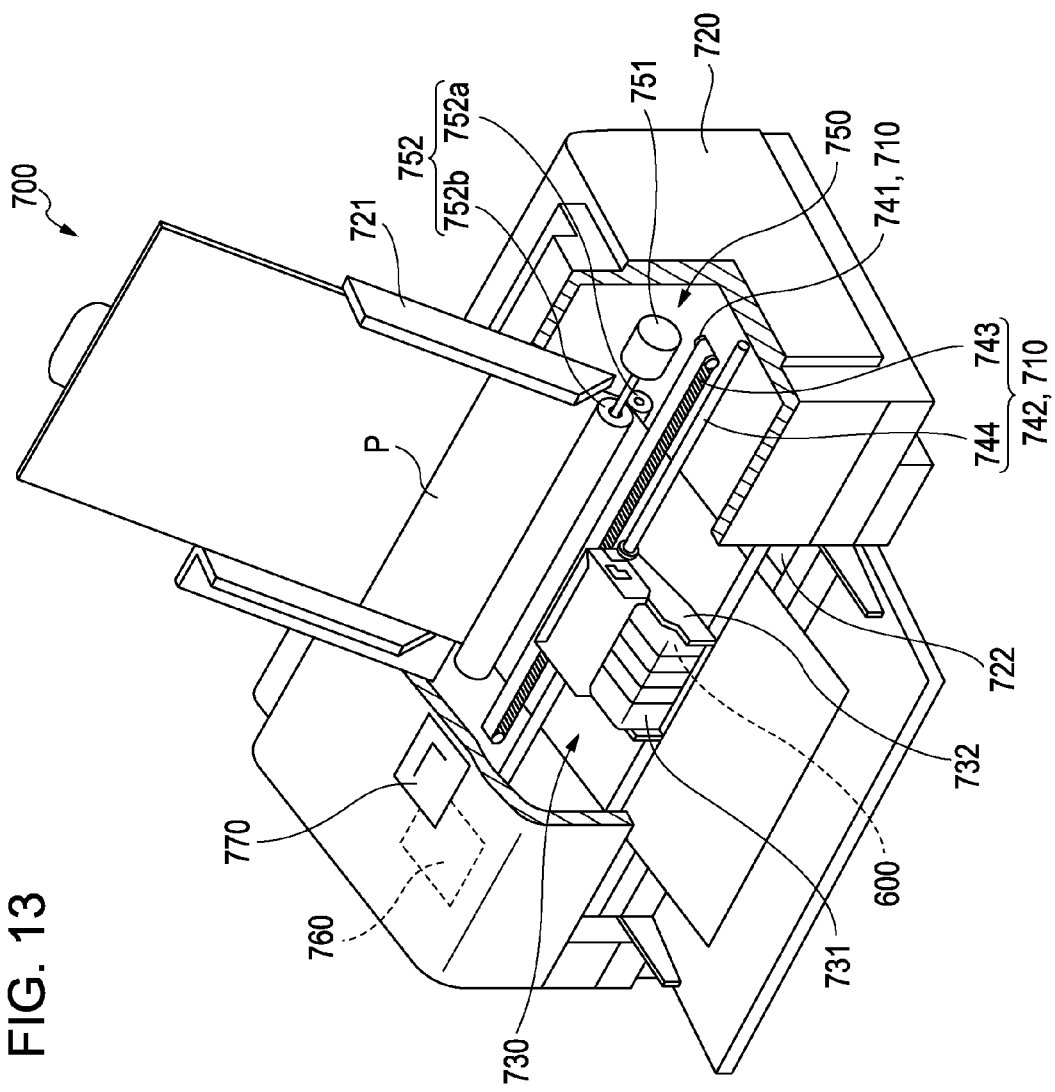
FIG. 13 is a perspective view schematically showing a liquid ejecting apparatus according to an embodiment of the invention.

Next, a liquid ejecting apparatus according to an embodiment of the present invention is described with reference to the drawing. FIG. 13 is a perspective view schematically showing a liquid ejecting apparatus 700 according to an embodiment of the invention. The liquid ejecting apparatus 700 includes the liquid ejecting head according to the present invention. Hereinafter, the case in which the liquid ejecting apparatus 700 is an ink jet printer including the above-described liquid ejecting head 600 is described.

As shown in FIG. 13, the liquid ejecting apparatus 700 includes a head unit 730, a driving portion 710, and a control portion 760. The liquid ejecting apparatus 700 may further include an apparatus body 720, a paper feed portion 750, a tray 721 on which recording paper P is placed, a discharge port 722 through which the recording paper P is discharged, and an operation panel 770 disposed on the upper surface of the apparatus body 720.

The head unit 730 includes an ink jet recording head (simply referred to as a "head" hereinafter) including the above-described liquid ejecting head 600. The head unit 730 is further provided with an ink cartridge 731 which supplies ink to the head and a carriage 732 on which the head and the ink cartridge 731 are mounted.

The driving portion 710 can reciprocate the head unit 730. The driving portion 710 includes a carriage motor 741 serving as a driving source of the head unit 730 and a reciprocating mechanism 742 which receives rotation of the carriage motor 740 to reciprocate the head unit 730.

The reciprocating mechanism 742 includes a carriage guide shaft 744 with both ends supported by a frame (not shown) and a timing belt 743 extended in parallel with the carriage guide shaft 744. The carriage guide shaft 744 supports the carriage 732 so that the carriage 732 can freely reciprocate. Further, the carriage 732 is fixed to a portion of the timing belt 743. When the timing belt 743 is traveled by operating the carriage motor 741, the head unit 730 reciprocates by being guided by the carriage guide shaft 744. During the reciprocation, ink is appropriately ejected from the head to perform printing on the recording paper P.

The control portion 760 can control the head unit 730, the driving portion 710 and the paper feed portion 750.

The paper feed portion 750 can transfer the recording paper P from the tray 721 to the head unit 730. The paper feed portion 750 includes a paper feed motor 751 serving as a driving source and a paper feed roller 752 which rotates by operation of the paper feed motor 751. The paper feed roller 752 is provided with a driven roller 752a and a driving roller 752b which are opposed to each other with a feed passage of the recording paper P provided therebetween. The driving roller 752b is connected to the paper feed motor 751. When the paper feed portion 750 is driven by the control portion 760, the recording paper P is transferred to pass below the head unit 730.

The head unit 730, the driving portion 710, the control portion 760, and the paper feed portion 750 are provided in the apparatus body 720.

The liquid ejecting apparatus 700 includes the liquid ejecting head 600 with high durability. Therefore, the liquid ejecting apparatus 700 has high reliability.

Although the ink jet recording apparatus 700 serving as an ink jet printer is described as an example of the liquid ejecting apparatus according to the present invention, the liquid ejecting apparatus according to the present invention can also be industrially used. In this case, as a liquid (liquid material) to be ejected, various functional materials with viscosity appropriately adjusted with a solvent or a dispersion medium can be used. Besides image recording apparatuses such as the above-described printer and the like, the liquid ejecting apparatus according to the present invention can be preferably used as a colorant ejecting apparatus used for producing color filters of a liquid crystal display and the like, a liquid material ejecting apparatus used for forming electrodes and color filters of an organic EL display, FED (surface emission display), an electrophoretic display, and the like, a bio-organic material ejecting apparatus used for producing bio-chips, and the like.

The above-mentioned embodiment and modifications are only examples, and the present invention is not limited to these. For example, two or more of the above-mentioned embodiment and modifications can be appropriately combined.

The present invention is not limited to the above-mentioned embodiment, and various modifications can be made. For example, the present invention includes substantially the same configuration (for example, a configuration having the same function, method, and results or a configuration having the same object and advantage) as the configuration described in the embodiment. Also, the present invention includes a configuration in which an unessential portion of the configuration described in the embodiment is replaced by another. Further, the present invention includes a configuration in which the same operation and advantage as the configuration described in the embodiment are exhibited or the same object can be achieved. Further, the present invention includes a configuration in which a known technique is added to the configuration described in the embodiment.

What is claimed is:

1. A piezoelectric element comprising:
   a first conductive layer;
   a second conductive layer disposed to face the first conductive layer; and
   a piezoelectric layer disposed between the first conductive layer and the second conductive layer and composed of a compound oxide containing at least lead, zirconium, titanium, and oxygen,
   wherein the piezoelectric layer includes a first crystal layer disposed on the first conductive layer side of the piezoelectric layer and a second crystal layer continued from the first crystal layer and disposed nearer to the second conductive layer side than the first crystal layer;
   in the piezoelectric layer, the lead concentration in the first conductive layer side of the first crystal layer is lower than that in the second conductive layer side of the second crystal layer; and
   in the piezoelectric layer, the oxygen concentration in the first conductive layer side of the first crystal layer is higher than that in the second conductive layer side of the second crystal layer,
   wherein the concentration of each element in the piezoelectric layer is defined by the following equation:

concentration of element=(peak intensity of that element/relative sensitivity factor)/Σ(peak intensity of each element/relative sensitivity factor)×100 where the relative sensitivity factor is a value normalized with respect to an average peak intensity of a stable region and a composition ratio.

2. The piezoelectric element according to claim 1, wherein the oxygen concentration in the first conductive layer side of the first crystal layer is higher than that in the second conductive layer side of the second crystal layer by a range of 4.7 atomic % or more and 8.7 atomic % or less.

3. The piezoelectric element according to claim 1, wherein the total thickness of the first crystal layer and the second crystal layer is 1/20 or more and 1/3 or less of the thickness of the piezoelectric layer.

4. A piezoelectric actuator comprising:
   the piezoelectric element according to any one of claim 1, 2, or 3; and
   a vibrating plate with flexibility provided in contact with the first conductive layer or the second conductive layer.

5. A liquid ejecting head comprising:
the piezoelectric actuator according to claim 4; and
a pressure chamber communicated with a nozzle orifice and changed in volume by an operation of the piezoelectric actuator.

6. A liquid ejecting apparatus comprising the liquid ejecting head according to claim 5.

\* \* \* \* \*